US006774619B1

(12) United States Patent
Verfuerth et al.

(10) Patent No.: US 6,774,619 B1
(45) Date of Patent: Aug. 10, 2004

(54) APPARATUS AND METHOD FOR COMPARISON OF ELECTRIC POWER EFFICIENCY OF LIGHTING SOURCES

(76) Inventors: Neal R. Verfuerth, 642 Western Ave., Random Lake, WI (US) 53075; Michael J. Potts, N7203 County Rd. J., Plymouth, WI (US) 53073

( * ) Notice: Subject to any disclaimer, the term of this patent is extended or adjusted under 35 U.S.C. 154(b) by 81 days.

(21) Appl. No.: 10/211,851

(22) Filed: Aug. 5, 2002

Related U.S. Application Data

(63) Continuation-in-part of application No. 10/166,541, filed on Jun. 11, 2002.

(51) Int. Cl.[7] .................................................. G01R 7/00
(52) U.S. Cl. ....................................................... 324/142
(58) Field of Search ............................ 324/103 R, 114, 324/142, 158.1; 702/60, 62; 700/286, 291, 293

(56) References Cited

U.S. PATENT DOCUMENTS 4,749,941 A 6/1988 Halder et al. ............... 324/142
5,349,289 A 9/1994 Shirai et al. ................ 324/127

*Primary Examiner*—David A. Zarneke
*Assistant Examiner*—Minh N. Tang
(74) *Attorney, Agent, or Firm*—Robert T. Johnson

(57) ABSTRACT

Apparatus and method for comparison of electric power efficiency of lighting sources includes electric power supply to a first circuit and first light, and electric power supply to a second circuit and second light, and a first light meter and a second light meter to measure the light intensity of the first light and second light respectively and a clamp-on ammeter on the electric power line to the first light source and a clamp-on ammeter on the electric power line to the second light source and each clamp-on ammeter connected to a separate window in a computer to show the amperes drawn by each light source, and each light meter connected to a window in the computer to determine equal light from each lighting source.

3 Claims, 2 Drawing Sheets

APPARATUS AND METHOD FOR COMPARISON OF ELECTRIC POWER EFFICIENCY OF LIGHTING SOURCES

This patent application is a CONTINUATION-IN-PART filing, under 37 CFR 1.53(b,2) of application Ser. No. 10/166,541 filed Jun. 11, 2002, having a file number OR-4-01, titled; APPARATUS AND METHOD FOR COMPARISON OF ELECTRIC POWER EFFICIENCY OF LIGHTING SOURCES TO IN EFFECT BE A VIRTUAL POWER PLANT.

BACKGROUND OF THE INVENTION

1. Summary of the Invention

Disclosure is made of apparatus and method for comparison of electric power demand or efficiency by different sources of lighting in an area.

2. Objects of the Invention

An object of this invention is to disclose apparatus to measure the electric the power demand of lighting sources having equal light intensity, at the working plane to determine the lowest cost lighting source, for highest efficiency of electric power demand.

Another object of this invention is to disclose a method for measuring, the electric power demand of lighting sources, having equal light intensity, at the working plane, to determine the lowest cost lighting source, for highest efficiency of electric power demand.

BRIEF DESCRIPTION OF DRAWINGS

BRIEF DESCRIPTION OF DRAWINGS

| FIG. NO. | DESCRIPTION |
|---|---|
| 1 | Single point incandescent light first light source. (elevation view) |
| 2 | Single point incandescent light first light source. (plan view) |
| 3 | Area fluorescent light; second light source. (elevation view) |
| 4 | Area fluorescent light, second light source. (plan view) |
| 5 | Mounting lay out of circuit components on computer panel. |

LEGEND DESCRIPTIONS

| LEGEND NO. | DESCRIPTION |
|---|---|
| 1 | Incandescent light; first circuit light source. |
| 2 | Fluorescent area light; second circuit light source. |
| 3 | Incandescent first circuit light meter dial. |
| 4 | Fluorescent area light second circuit light meter dial. |
| 5 | First light source circuit ampere meter reading dial. |
| 6 | Second light source circuit ampere reading dial. |
| 7 | Incandescent first circuit light meter [[activator]]. |
| 8 | Fluorescent second circuit light meter [[activator]]. |

-continued

LEGEND DESCRIPTIONS

| LEGEND NO. | DESCRIPTION |
|---|---|
| 9 | First circuit clamp-on ampere meter. |
| 10 | Second circuit clamp-on ampere meter. |
| 11 | Wire connection from first circuit clamp-on ampere meter to ampere reading dial. |

| LEGEND NO. | DESCRIPTION |
|---|---|
| 12 | Wire connection from second circuit clamp-on ampere meter to ampere reading dial. |
| 13 | Electric power line from power supply to first circuit incandescent light. |
| 14 | Electric power line from power supply to second circuit fluorescent area light. |
| 15 | Electric power supply source. |
| 16 | Computer panel. |
| 17 | Switch in electric power line from power supply to first circuit incandescent light. |
| 18 | Switch in electric power line from power supply to second circuit fluorescent light. |
| 19 | Electric power supply line to computer. |
| 20 | Switch in electric power supply line to computer. |
| d | Distance from light fixture to the work plane. |

The word "dial" in above legends 3,4,5,6,11 and 12 is meant to include "window" to display information of light meters and ampere readings.

DETAILED DESCRIPTION OF THE INVENTION

Electric power demand for lighting in buildings is costly and in view of this effort is made to find and determine low cost lighting, based on electric power demand, and at the same time have adequate or equal lighting at the work plane.

Figure 1:
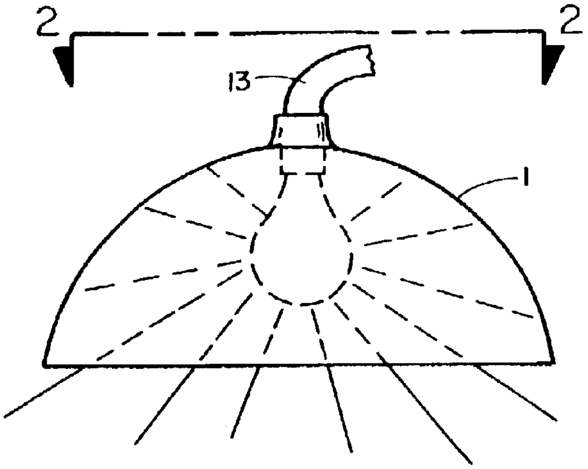
Figure 2:
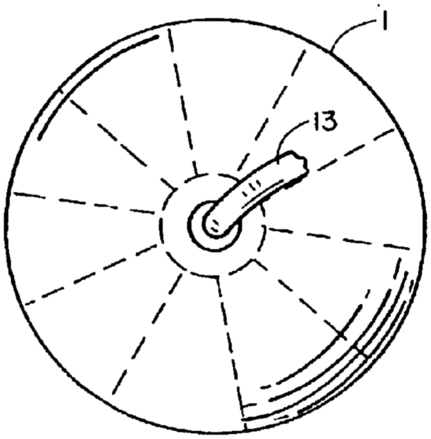
Figure 3:
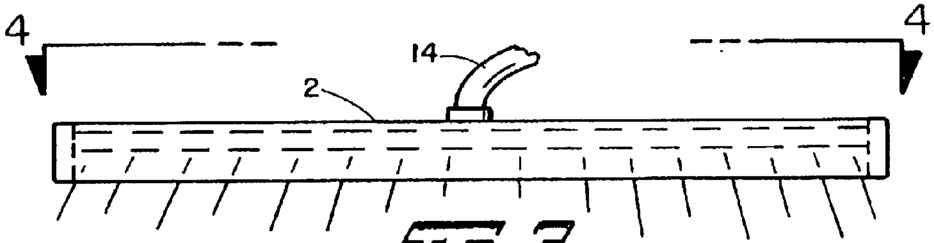
Figure 4:
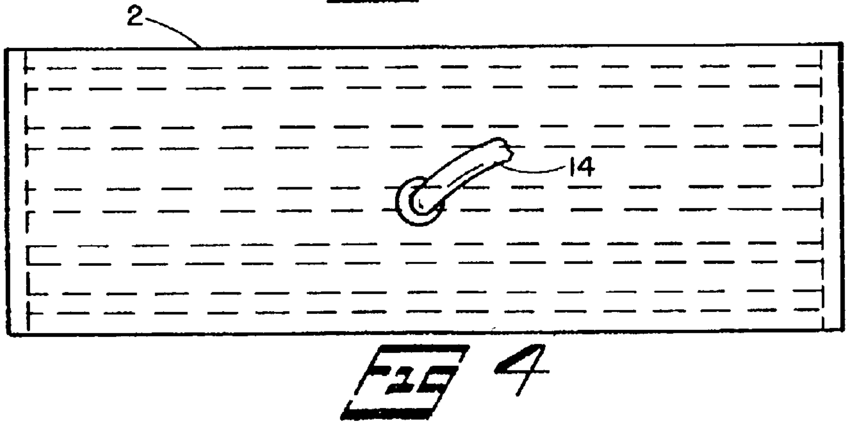

Referring now to the drawings, FIG. 1 shows a single point incandescent first circuit light source, in elevation view, and has legend 1, as incandescent light; first light source. FIG. 2, is a plan view of the single point incandescent light first circuit light source, same light as FIG. 1. FIGS. 3 and 4 disclose area fluorescent light, second circuit light source 2, elevation view and plan view respectively, legend 2 identifies the fluorescent area light; second circuit light source.

Figure 5:
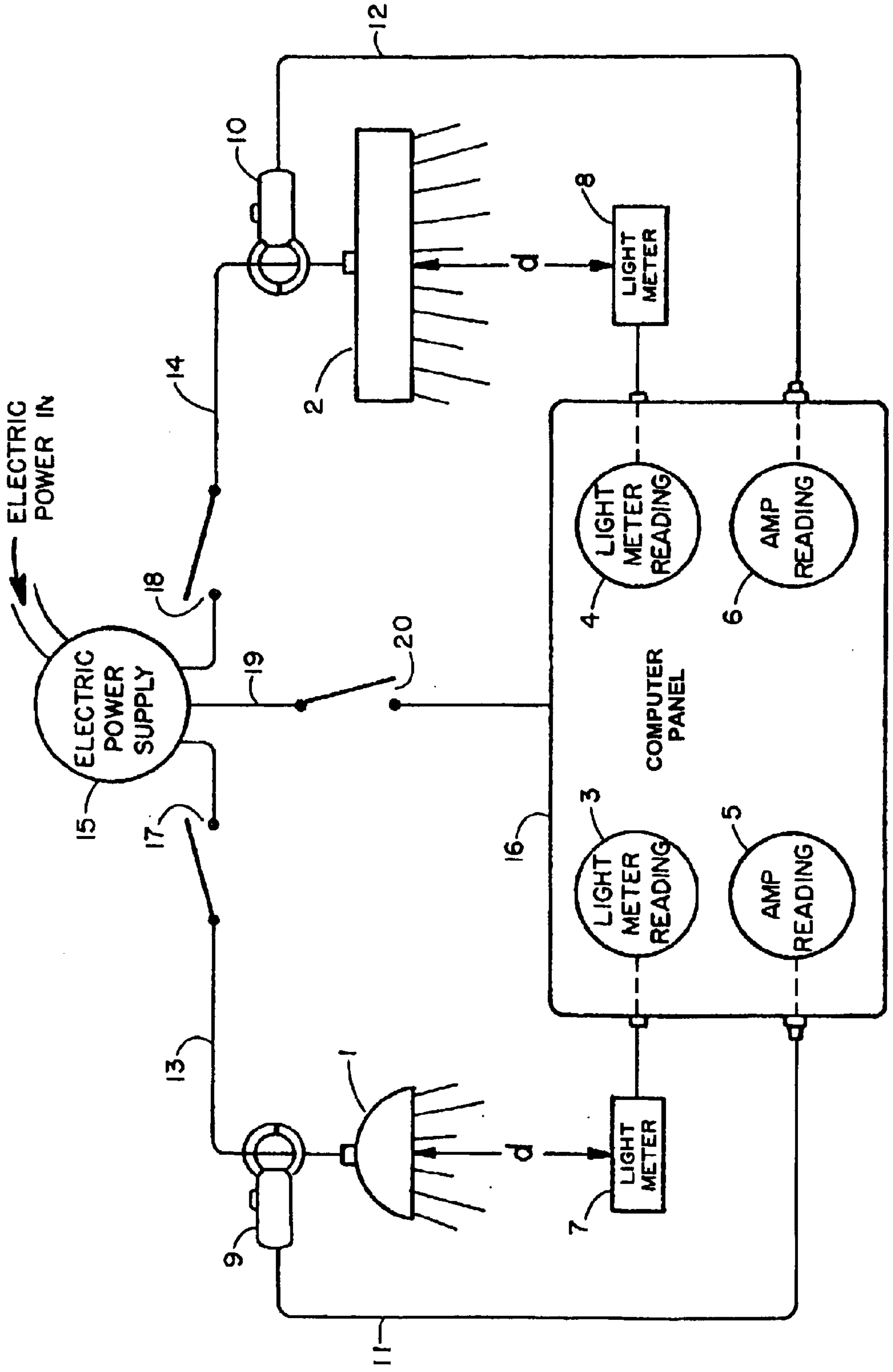

FIG. 5 is described as the mounting layout of circuit components and includes incandescent first circuit light source 1, on the first circuit and second circuit light source 2 on the second circuit which for comparative purposes is a fluorescent luminaire 2, which can be described as an area light, as opposed to an incandescent single element light source 1.

The electric power supply 15 is connected to each circuit separately. Electric power line 13, from power supply 15, connected to first circuit incandescent light 1, and electric power line 14 from power supply 15 to second circuit fluorescent area light 2. Light meter 7 is placed at the work plane under incandescent light 1, to indicate a light meter reading of lumens for example at light meter reading in window 3, mounted on computer panel 16. The electric power line 14, from power supply 15, connected to second circuit light source, in this example a fluorescent light 2. Light meter 8 is placed at the work plane under second light source 2 fluorescent light, to show a light meter reading, of lumens, in window 4.

The light at the work plane is indicated by the light meter readings in windows 3 and 4, and to determine the electric power demand for each circuit. Clamp-on ammeter 9 connected to ampere meter window 5 on computer panel 16 indicates amperes in line 13, when clamp-on meter 9 clamp surrounds line 13, when the first light source 1 is activated by closing switch 17. This is for the incandescent light 1. Clamp-on ammeter 10, connected to ampere meter window 6 on computer panel 16, indicates amperes in line 14, when the clamp-on meter 10 clamp surrounds line 14, when the second light source switch 18 is closed.

First circuit clamp-on ammeter 9, connected to first light source circuit ampere meter reading dial 5, through wire connection 11, from first circuit clamp-on ampere meter 9 to ampere reading dial 5.

Second circuit clamp-on ampere meter 10, connected to second light source circuit ampere meter reading dial 4, through wire connection 12, from second circuit clamp-on ampere meter 10 to ampere reading dial 4.

To compare the light intensity of the lights 1 and 2, the distance "d" of the light fixture from the work plane should be the same for direct comparison. The "work plane" is to be described as the work area above the floor where the work is done and may be from three feet to four feet above the floor.

In the above discussion the first circuit pertains to the circuitry of the incandescent light 1, while the second circuit pertains to the second light or fluorescent light 2.

The above described invention is suitable for comparison of any electric lighting systems, based on electric power demand for a given or set light intensity.

The apparatus for comparison of electric power efficiency of lighting sources includes a first light source 1, and a second light source 2, each of the light source connected to a common electric power supply or source 15, and a first light meter 7, under the first light source 1, and the first light meter 7 connected to a window display 3 in the computer 16.

The first light source 1, aimed at its respective first light meter 7, and a second light meter 8 under a second light source 2, and the second light meter 8 connected to a display window 4 in the computer 16, and the second light source 2 aimed at the respective second light meter 8. A clamp-on ammeter 9 to apply on the electric power source 13 to the first light source 1, and a second clamp-on ammeter 10 to apply on the electric power source 14 to the second light source 2. A clamp-on ammeter 9 on the electric power line 13 to the first light source 1 wired to a computer 16 first panel display window 5 and, a clamp-on ammeter 10 on the electric power line 14 to the second light source 2, wired to a second panel display window 6 of the computer 16. An electric switch 17 on line 13 to the first light source 1, and electric switch 18 on line 14 to light source 2.

The light meter 7, may be placed on the work plane at a distance d, from the first light 1, and light meter 8 at a distance d from light source 2, for comparison of efficiency of the lighting system.

Reference is made to FIG. 5, including legend 19, electric power supply line from electric power supply to computer panel 16, and switch 20 in electric power supply line 19, from electric power supply to computer panel 16.

The prior art U.S. Pat. Nos. 4,749,941 for MEASURING TWO ELECTRICAL QUANTITIES and 5,349,289 for CLAMP-ON MULTIMETER cited in this application, do not either singly or collectively preclude allowance and issue of a patent on this application.

It is to be pointed out that savings had on power supply to most efficient lighting source as disclosed above represents savings in power supply to be equivalent to a virtual power plant, thus conserving investment in power generation and protection of the environment.

We claim:

1. Apparatus for comparison of electric power efficiency of lighting sources comprising:

a. a first light source and a second light source each said light source connected to a common electric power source, b. a first light meter under said first light source, and said first light meter connected to a display window in a computer c. said first light source aimed at its respective first light meter, d. a second light meter under said second light source, and said second light meter connected to a display window in said computer, e. said second light source aimed at its respective second light meter, f. a clamp-on ammeter clamped on electric power source to said first light source, g. a clamp-on ammeter clamped on electric power source to said second light source, h. said clamp-on ammeter on electric power line to said first light source wired to a computer first panel display window, i. said clamp-on ammeter on said electric power line to said second light source, wired to a second panel display window of said computer and, j. an electric switch on line from said electric power source to said first light source, and an electric switch on line from said electric power source to said second light source.

2. Method of comparison of electric power efficiency of lighting sources comprising:

a. a first light source and a second light source each said light source connected to a common electric power source voltage, b. an electric switch on line from said power supply to said first light source, and an electric switch on line from said power supply to said second light source, and each said electric switch in a closed position, c. a first light meter under said first light source, connected to a first display window in a computer, and a second light meter under said second light source connected to a second display window in said computer, d. said first light source aimed at its respective first light meter, e. said second light source aimed at its respective second light meter, f. a clamp-on ammeter clamping on electric power source to said first light source, g. a clamp-on ammeter clamping on electric power source to said second light source, h. said clamp-on ammeter on electric power line to said first light source wired to a computer first panel display window, and i. said clamp-on ammeter on electric power line to said second light source, wired to a second panel display window of said computer.

3. Apparatus for comparison of electric power efficiency of lighting sources of claim 1 or 2, further comprising:

a. two of said clamp-on ammeters, one of said clamp-on ammeters on each of first circuit and second circuit power lines from electric power supply to first lighting fixture and to second lighting fixture.

* * * * *